(12) United States Patent
King et al.

(10) Patent No.: US 6,429,528 B1
(45) Date of Patent: *Aug. 6, 2002

(54) MULTICHIP SEMICONDUCTOR PACKAGE

(75) Inventors: Jerrold L. King, Morgan Hill, CA (US); Jerry M. Brooks, Caldwell, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/032,191

(22) Filed: Feb. 27, 1998

(51) Int. Cl.[7] .......................... H01L 23/48; H01L 23/52; H01L 29/40; H01L 23/34; H01L 21/44
(52) U.S. Cl. .................. 257/775; 257/692; 257/691; 257/723; 257/725; 257/773; 257/786; 438/599; 438/598; 438/612; 438/613
(58) Field of Search ................................ 257/723, 724, 257/725, 684, 690, 691, 773, 776, 786, 784, 692, 775, 780, 738; 438/599, 598, 612, 613

(56) References Cited

U.S. PATENT DOCUMENTS

| | | | |
|---|---|---|---|
| 5,255,156 A | 10/1993 | Chang | ......................... 361/783 |
| 5,444,303 A | * 8/1995 | Greenwood et al. | ........ 257/786 |
| 5,504,373 A | 4/1996 | Oh et al. | ..................... 257/734 |

(List continued on next page.)

FOREIGN PATENT DOCUMENTS

| | | | | |
|---|---|---|---|---|
| DE | 196 00 401 A1 | | 7/1997 | |
| DE | 197 14 470 A1 | | 12/1997 | |
| EP | 0 398 628 | * | 5/1990 | ......... H01L/23/538 |
| EP | 0 398 628 | | 11/1990 | |
| EP | 0 413 451 A2 | | 2/1991 | |
| EP | 0 853 337 A1 | | 7/1998 | |
| WO | WO 92/17901 | | 10/1992 | |

OTHER PUBLICATIONS

Van Zant, Peter; "Microchip Fabrication"; McGraw–Hill; Third edition; New York; 1997, p. 545.*

Harper, Charles A.; Miller, Martin B.; "Electronic Packaging, Microelectronics and Interconnection Dictionary"; McGraw–Hill; New York; 1993, p. 211.*

*Primary Examiner*—George Fourson
*Assistant Examiner*—Neal Berezny
(74) *Attorney, Agent, or Firm*—Workman, Nydegger & Seeley

(57) ABSTRACT

A multichip semiconductor package, and method of making is provided that has a plurality of semiconductor chips fabricated in electrical isolation one from another integrally on a singular coextensive substrate useful for numerous and varied semiconductor chip applications. The semiconductor chips, instead of being singulated into a plurality of single-chip packages, are kept as integrally formed together and are thereafter electrically connected together so as to form a larger circuit. Encapsulated follows so as to form a single, multichip package. Common signals of the plurality of semiconductor chips are bussed together in electrical common across the substrate to a common electrode suitable for electrically providing the signal to another, external circuit, such as a PWB. The common bussing is achieved by conductive leads disposed across the substrate in pair sets having an extended portion that accommodates the common electrode in contact therewith. The common electrode contacts the conductive lead through an opening formed in the encapsulant that surrounds the substrate. The extended portions of each conductive lead are staggered with respect to the extended portion of the conductive lead in the same, or juxtaposed, pair set. In this manner, multiple electrodes are available for close proximity positioning while, simultaneously, avoiding electrical shorts amongst the pair sets.

19 Claims, 4 Drawing Sheets

U.S. PATENT DOCUMENTS

| | | | |
|---|---|---|---|
| 5,544,124 A | 8/1996 | Zagar et al. | 365/230.08 |
| 5,642,262 A | 6/1997 | Terrill et al. | 361/783 |
| 5,656,863 A * | 8/1997 | Yasunaga et al. | 257/778 |
| 5,677,566 A | 10/1997 | King et al. | 257/666 |
| 5,734,559 A * | 3/1998 | Banerjee et al. | 361/761 |
| 5,843,799 A * | 12/1998 | Hsu et al. | 438/6 |
| 5,936,844 A | 8/1999 | Walton | 361/760 |
| 5,946,314 A | 8/1999 | Licciardi et al. | 370/398 |
| 6,108,210 A | 8/2000 | Chung | 361/747 |
| 6,111,205 A | 8/2000 | Leddige et al. | 174/260 |

* cited by examiner

FIGURE 3
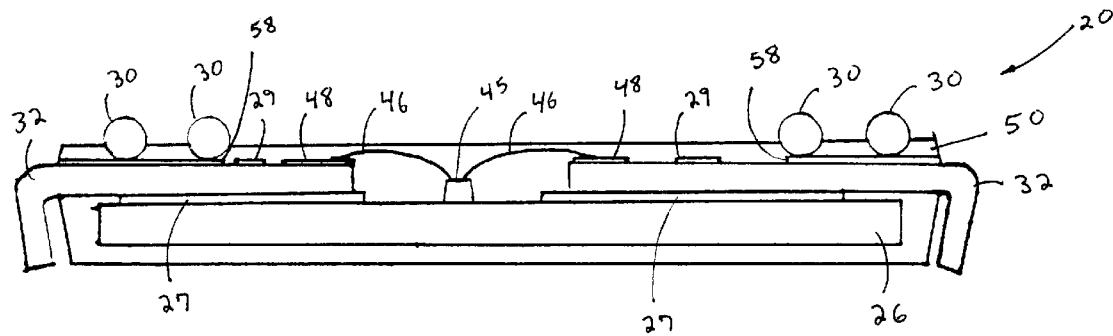
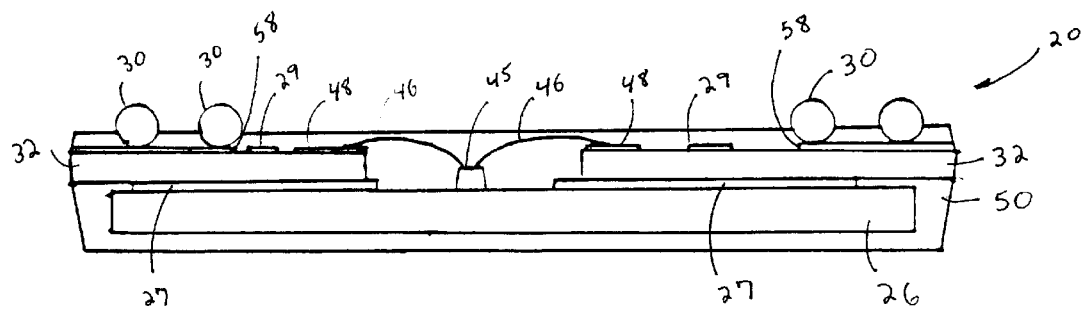
FIGURE 4

MULTICHIP SEMICONDUCTOR PACKAGE

BACKGROUND OF THE INVENTION

1. The Field of the Invention

The present invention relates generally to multichip semiconductor packages and particularly relates to an improved semiconductor package having a plurality of semiconductor chips fabricated as a singular coextensive substrate and to its method of making.

2. The Relevant Technology

Multichip packaging is one of the fastest growing disciplines in the chip packaging industry. Initially, the multichip package came into existence for applications requiring numerous and varied circuits configured into a least amount of space, such as with mainframes and supercomputers. Since then, multichip packages have transcended traditional boundaries and moved into conventional single-chip applications because they characteristically possess reduced weight and size per each circuit, increased reliability and increased electrical performance. As such, multichip packages are now regularly employed in consumer electronics, medical and avionic devices, and in the automotive and aerospace industries. Multichip packages also find particular usefulness in telecommunication applications because of their high bandwidth performance.

In general, conventional multichip packages are available in one of two varieties. One has two or more bare chips bonded directly to a multichip substrate and the other, the most commercially predominant package, having two or more pre-packaged single-chips, in their respective single-chip carriers and bonded to a multichip substrate. Although the former variety enjoys advantages over the latter, both varieties remain bound by single-chip constraints because of their dependence upon either a bare, or packaged, single-chip. As such, both varieties frequently share common problems with their single-chip counterparts.

For example, in response to an industry-wide demand for high lead counts and small "footprints," i.e., the arrangement of electrical contacts on the printed circuit board to which the chip package is ultimately connected, single-chip packages became available in Ball Grid Array (BGA), "flip-chip" and "chip-scale" packages. The problem, however, is that these singular-chip packages have external electrodes, which can be solder balls, that are directly attached to contacts on the surface of the semiconductor chip. As semiconductor chips are continually reduced in size, the arrangement of the external electrodes must also be continually reconfigured into a correspondingly smaller size. In turn, the footprint on the printed circuit board must also be continually reconfigured. This problem is even further amplified with multichip packages because footprint reconfiguration also needs to occur on the multichip substrate itself to which the single-chip packages are attached. It is, therefore, desirous to eliminate the continual reconfiguring of the footprint of the multichip package and the rearrangement of the multichip substrate.

In a separate and distinct discipline, Wafer Scale Integration (WSI) techniques have been used to fabricate various other multichip arrangements. Yet WSI often utilizes 800, or more, semiconductor chips as a single multichip which, in effect, is too cumbersome, if not prohibitive, to encapsulate into a package format. The large size is also inefficient for applications requiring relatively few semiconductor chips, around 64 or less, because of the high wiring density used in WSI wirebonding operations and the surplus unneeded chips. Effective testing of each individual chip with WSI is also problematic because of the large number of chips. Additionally, WSI techniques frequently require expensive photolithography equipment, not typically utilized with single-chip packages, to transfer a circuit image onto a multichip substrate.

A need exists for a multichip package that overcomes the foregoing problems.

SUMMARY OF THE INVENTION

In accordance with the invention as embodied and broadly described herein, a novel multichip semiconductor package, and method of making, is provided that has a plurality of semiconductor chips fabricated in electrical isolation, one from another, as a singular coextensive semiconductor substrate useful for numerous and varied semiconductor chip applications. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above. As such, silicon on insulator and silicon on sapphire are within the definition of substrate.

Once fabricated, instead of being singulated into a plurality of single-chip packages, the semiconductor chips are kept integrally on the substrate. The semiconductor chips, which are electrically isolated one from another, are then wired so as to be electrically connected together to form a larger circuit, such as to expand a memory circuit, and then encapsulated and processed into a single, multichip package.

In a preferred embodiment, a multichip package has a plurality of electrically isolated semiconductor chips integrally formed on a unitary semiconductor substrate. A plurality of conductive leads electrically connect the electrically isolated semiconductor chips. A compound substantially encapsulates at least a portion of the semiconductor substrate, and a plurality of electrodes extend through the compound to make contact with the conductive leads.

In another preferred embodiment, a multichip semiconductor package includes a plurality of electrically isolated semiconductor chips that are integrally formed on a unitary semiconductor substrate, each semiconductor chip having an active device formed thereon. The multichip semiconductor package also includes a plurality of bond pads, each bond pad being electrically connected one per each active device. A plurality of conductive leads electrically connect the electrically isolated semiconductor chips, where each conductive lead is electrically connected one per each bond pad. A compound substantially encapsulates at least a portion of the semiconductor substrate, the bond pads, and the conductive leads. There are also a plurality of solder balls, where each solder ball extends through the compound to make contact with a respective one of the conductive leads.

In yet another preferred embodiment, the common signals of the plurality of semiconductor chips are bussed in electrical common across the substrate to a common electrode suitable for electrically providing the signal to another, external circuit, such as a Printed Wiring Board (PWB). The common bussing is achieved by conductive leads disposed across the substrate in pair sets having an extended portion that accommodates the electrode in contact therewith. The electrode contacts the conductive lead through an opening formed in the encapsulant that surrounds the substrate. The extended portions of each conductive lead are staggered with respect to the extended portion of the conductive lead in the same, or juxtaposed, pair set. In this manner, multiple electrodes are available for close proximity positioning while, simultaneously, avoiding electrical shorts amongst the pair sets.

In an alternate embodiment, the conductive leads extend beyond the encapsulant to facilitate testing or improve manageability of the package during the manufacturing process. The conductive leads, after the testing or manufacturing, may then be sheared flush to avoid mechanical interferences between the external circuit, i.e., the PWB, or to create a stronger and thicker multichip package.

A method of making the inventive multichip package includes providing a unitary semiconductor substrate and integrally forming a plurality of electrically isolated semiconductor chips on the unitary semiconductor substrate. There is then formed a plurality of conductive leads that electrically connect the electrically isolated semiconductor chips. A compound then substantially encapsulates at least a portion of the semiconductor substrate, and a plurality of electrodes are formed so as to extend through the compound to make contact with the conductive leads.

Another method of making the inventive multichip package includes providing a unitary semiconductor substrate. A plurality of electrically isolated semiconductor chips are integrally formed on the unitary semiconductor substrate each having an active device formed thereon. A plurality of bond pads are formed so as to make electrical connections from each bond pad to one of the active devices. Electrical connections are also formed to electrically connect the electrically isolated semiconductor chips with a plurality of conductive leads. Each conductive lead is electrically connected one per each bond pad. A compound is formed so as to substantially encapsulate at least a portion of the semiconductor substrate, the bond pads, and the conductive leads. A plurality of solder balls are formed so as to extend through the compound to make contact with a respective one of the conductive leads.

A still further method of making the inventive multichip package includes a singular substrate being fabricated with a plurality of electrically isolated semiconductor chips integrally formed thereon. Centrally located bond pads are provided for connection with the active devices of the chips by exposing the bond pads through apertures in an insulating or passivation layer which forms the upper surface of each chip. Conductive leads are positioned over the chips and are extended in length to an area near the bond pads for wire bonding connections thereto. The conductive leads are attached to an upper surface of the chips with Lead-Over-Chip (LOC) tape. The multichip package is at least partially encapsulated with a compound, and openings are formed in the compound to at least partially expose the conductive leads. Electrodes are made to contact the conductive leads that are exposed through the openings in the compound.

These and other features of the present invention will become more fully apparent from the following description and appended claims, or may be learned by the practice of the invention as set forth hereinafter.

BRIEF DESCRIPTION OF THE DRAWINGS

In order to more fully understand the manner in which the above-recited and other advantages of the invention are obtained, a more particular description of the invention will be rendered by reference to the specific embodiments thereof which are illustrated in the appended drawings. Understanding that these drawings depict only typical embodiments of the invention and are not therefore to be considered to be limiting of its scope, the invention in its presently understood best mode for making and using the same will be described and explained with additional specificity and detail through the use of the accompanying drawings in which:

FIG. 3 is a cross section view of a multichip package having conductive leads extending beyond the encapsulating compound according to another embodiment of the present invention;

FIG. 4 is a cross section view of a multichip package having conductive leads sheared flush with the encapsulating compound according to a further embodiment of the present invention.

DETAILED DESCRIPTION OF THE PREFERRED EMBODIMENTS

The present invention relates to a novel multichip semiconductor package having a plurality of semiconductor chips fabricated as a singular coextensive substrate and to its method of making.

Figure 1:
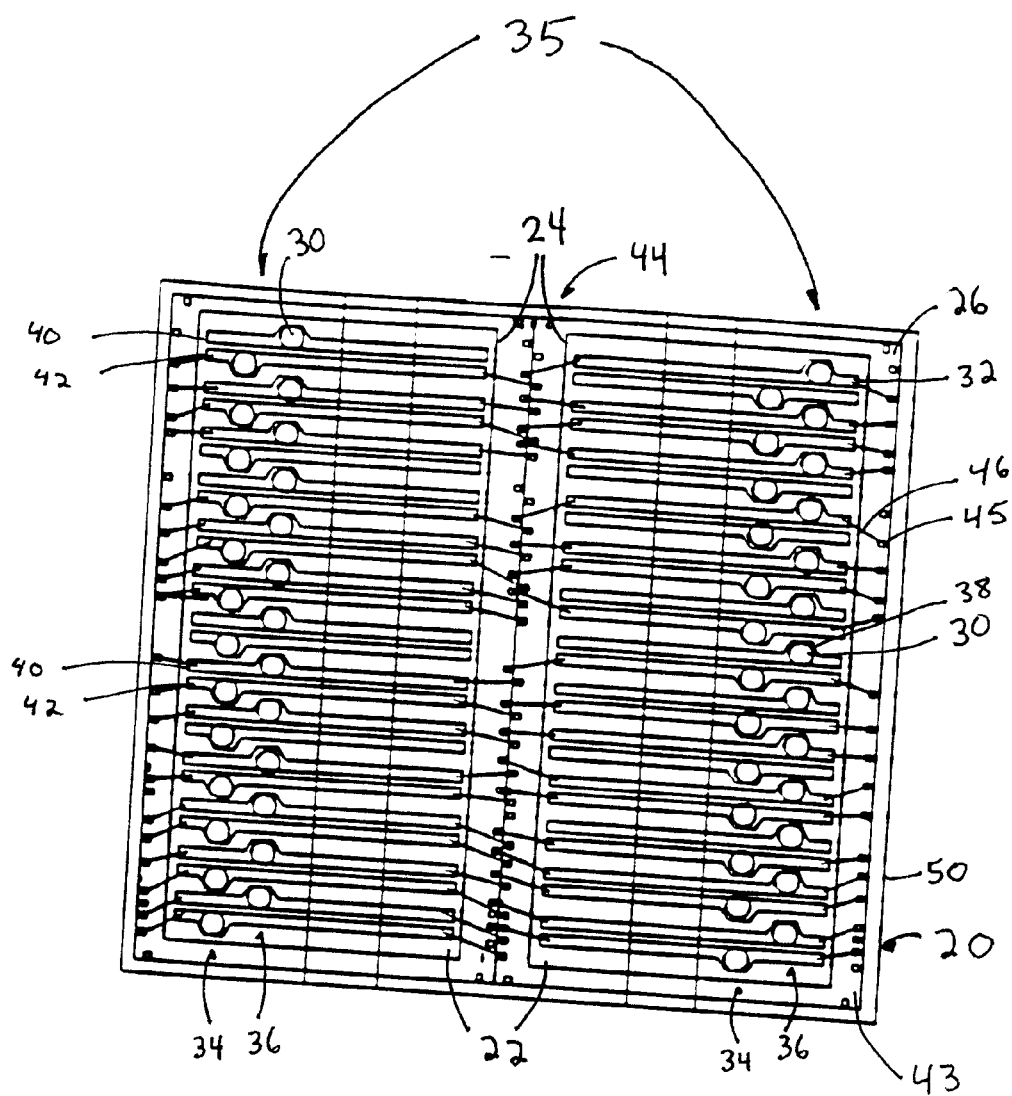
FIG. 1 is a top view of a multichip package as taken from beneath a top layer of encapsulating material according to one embodiment of the present invention.
Figure 2:
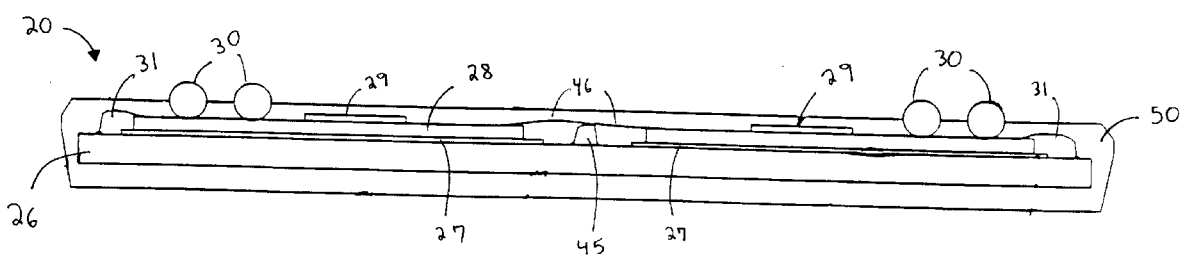
FIG. 2 is a cross section view of the multichip package of FIG. 1 taken along line 2—2.

With reference to FIGS. 1 and 2, a multichip semiconductor package, depicted generally as package 20, has a plurality of semiconductor chips 22 each arranged in electrical isolation, one from another, adjacently along a terminal boundary 24 thereof as a singular coextensive substrate 26. Chips 22 are integrally formed on substrate 26 which may be a semiconductor material such as gallium arsenide, silicon, or can be silicon on sapphire, silicon on insulator. Substrate 26, preferably a monocrystalline silicon wafer, has the individual semiconductor chips 22 fabricated thereon by conventional techniques currently employed in the manufacture of single-chip packages. The difference, however, is that instead of dividing individual chips 22 into discrete single-chip packages by a singulation process performed upon the wafer, the individual chips, though electrically isolated one from another, and then electrically connected are then encapsulated into a singular multichip package 20 as described hereinafter.

In particular, attached to semiconductor chip 22, preferably by lamination techniques using a lead-over-chip (LOC) adhesive 27, a lead locking tape 29, and a wire bonding segment 31, is a lead frame 28 to which electrodes 30 are electrically contacted. Lead frame 28 is provided, one per package 20, to yield electrical continuity between electrodes 30 and the internal devices of semiconductor chip 22 by way of a singular conductive lead 32, one per each electrode 30. Electrode 30 is connected to conductive lead 32 at a selected position along a length thereof. It should be appreciated that each selected position of connection between each electrode 30 and each respective conductive lead 32 yields an arrangement of electrodes 30 about package 20, known commonly as a package footprint. The package footprint has a corresponding footprint on a PWB (not shown), for example, that allows for completion of an electrical circuit between the internal devices of package 20 and the circuit fabricated on the PWB when the two footprints are electrically connected. Advantageously, since each electrode 30 is not directly connected to semiconductor chip 22 by way of bond pads or wiring traces, as are conventional BGA's, flip-chips, and chip-scale packages, the package footprint can remain consistent in size and shape despite continual size reductions in individual semiconductor chips. This is possible because the length of conductive lead 32 acts as an electrical bus from the internal devices in semiconductor chips 22 to the position of electrode 30. As semiconductor chip 22 is reduced in size, the dimensions of conductive lead 32 are adjusted and electrical continuity remains bussed out to electrode 30. Typically, as in FIGS. 3 and 4, conductive leads 32 are plated at an electrode bond area 58 with a thin layer of metal to improve the strength and conductivity between electrode 30 and conductive lead 32. Since electrodes 30 can be solder balls, the metal composition thereof is preferably gold, palladium/nickel, or tin.

In the preferred embodiment of FIG. 1, the package footprint has rows 35 of electrodes 30 disposed across semiconductor chips 22 in two substantially parallel lines 34, 36 with each individual electrode 30 being contacted, one per each conductive lead 32, along an extended portion 38 of the substantially rectangular conductive lead. The extended portion is present on conductive lead 32 because the width of the remainder of conductive lead 32, while a cost effective use of materials, is too thin to fully accommodate electrode 30. It should be appreciated that electrode 30 only exceeds the width of conductive leads 32 to the extent necessary to prevent mechanical bonding failures, such as solder joint failures.

Conductive leads 32 are preferably arranged in sets of pairs 40, 42 across semiconductor chips 22. Each pair set 40, 42 is arranged in relatively close proximity. Each extended portion 38 of each conductive lead 32 is staggered with respect to another extended portion 38 of conductive lead 32 in the same or juxtaposed to pair set 40, 42. In this manner, multiple electrodes 30 are available for close proximity positioning while, simultaneously, avoiding electrical shorts in and amongst pair sets 40, 42 which would otherwise occur with electrodes of the size and shape depicted if electrodes 30 were all placed side-by-side in a linear fashion. Yet, it should be appreciated that changes in the size and shape of electrode 30 are contemplated that would yield other distinct package footprints without altering the fabrication or effectiveness of singular coextensive substrate 26 having a plurality of semiconductor chips 22 integrally formed thereon. For example, it is contemplated that the portion of electrode 30 contacting conductive lead 32 can be reduced in area to a size that does not exceed the pitch of conductive leads 32, thereby making extended portions 38 superfluous. It is also contemplated that extended portions 38 could be alternated at opposite ends of their respective pair sets 40, 42 or arranged in other ways that maintain a cost effective conductive lead 32 while preventing electrical shorts.

The plurality of semiconductor chips 22 are electrically bonded together, along a periphery 43 and a central portion 44 of package 20, by way of bond pads 45 and bond wires 46 to form, for example, a larger package circuit, or as in a preferred embodiment, to expand the overall memory of semiconductor chips, such as DRAM semiconductor chips. It is to be appreciated that the bond pads can be any of the various terminals formed near the surface of semiconductor chip 22 through which electrical connections can be made between the active devices in chip 22 and external circuits. Bond wires 46 are preferably connected along a terminal end 48 of conductive leads 32 at a wire bond area as depicted in FIGS. 3 and 4. Typically, conductive leads 32 are plated at wire bond area 56 with a thin layer of metal suitable for wire bonding, such as gold, silver or palladium/nickel to improve the strength and conductivity of the bond between conductive leads 32 and bond wires 46.

Package 20 is encapsulated in a compound 50 which has openings formed therein that partially expose conductive leads 32 at the selected connection positions, which is preferably electrode bond area 58. The openings are sized and shaped according to the selected size and shape of electrodes 30 and are adjustable to correspond with changes in the selected size and shape. Compound 50, often a molding compound, is generally an electrically insulating formulation used to distribute power, dissipate heat and protect the active devices therein from thermomechanical stresses and pollutants found in the operating environment. Preferably, compound 50 is a thermosetting epoxy resin, but may also be silicon, phenolic, or polyeurethane. The composition of compound 50 is generally derived from a balance of numerous engineering factors including the cost of manufacturing, production volume, expected use environment, expected use market and other related considerations. It is also contemplated that compound 50 may be a polyimide compound useful as an alpha barrier.

In the preferred embodiment depicted in FIG. 2, conductive leads 32 have been fully encapsulated within compound 50. There are other useful embodiments for conductive leads 32. For example, in FIG. 3, conductive leads 32 are extended out from compound 50 to facilitate chip testing and also to enable package 20 to be easily maneuvered during the manufacturing process. It is also contemplated that conductive leads 32 could remain attached to semiconductor chips 22 without any of, or as a compliment to, electrodes 30 so that a signal could be taken directly therefrom as package 20 is used in either a surface mount, or through-hole capacity. In FIG. 4, conductive leads 32 have been sheared flush with compound 50 after either testing or manufacturing in order to create a thicker and stronger terminal portion of package 20, or to remove any potential mechanical interferences from conductive leads 32.

Figure 5:
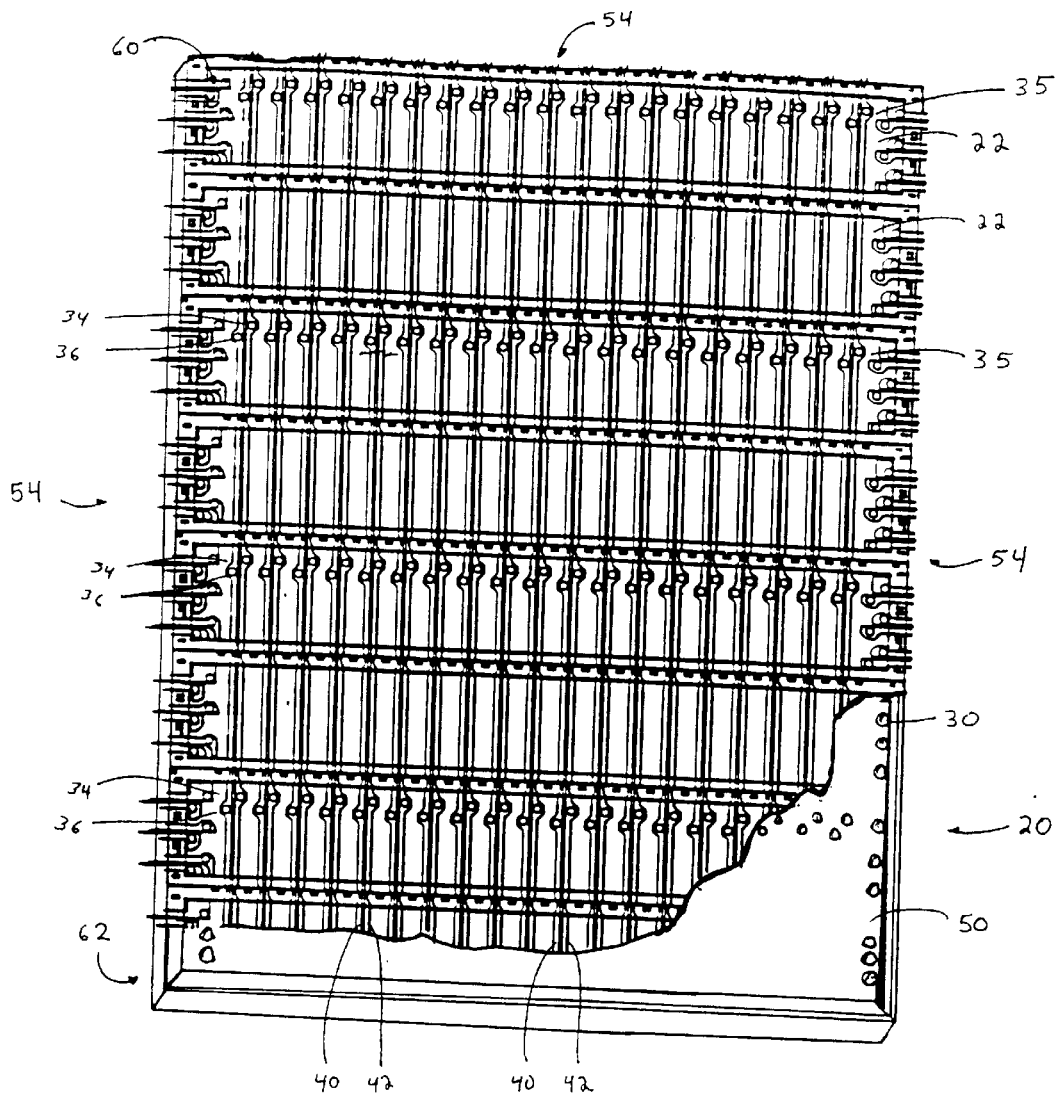
FIG. 5 is a top perspective view of a multichip package with a cut-away view through the encapsulating material to reveal eight semiconductor chips and a plurality of common busses across the semiconductor chips according to a still further embodiment of the present invention.

With reference to FIG. 5, package 20 has eight semiconductor chips 22 adjacently arranged in electrical isolation, in the manner previously described, with conductive leads 32 again disposed in pairs 40, 42 across substrate 26. Instead of the semiconductor chips 22 being interconnected by discretely wiring conductive leads 32 thereof, conductive leads 32 in this embodiment are bussed common to eliminate high wiring density within package 20 and to provide for redundant back-up in the event a semiconductor chip 22 has a bad, or deteriorated, signal line. The common bussing also allows for common addresses (AO, Al . . . An), common data out (DO), common data queries (DQ) or voltage steady state (Vss) electrodes, for example, to be fabricated together electrically, thereby eliminating electrode repetition and reducing material costs. Although some signal lines are independent and cannot, for various reasons, be bussed common, such as individual chip enables (CE) and row address strobes (RAS), those signal lines can be grouped together into common areas for efficaciously facilitating interconnection with an external circuit, such as a PWB. For example, a plurality of wiring banks 54 are configured about the periphery of package 20 along three sides and about the interior of package 20 in rows 35 having two substantially parallel lines 34, 36 of electrodes 30. It should be understood that wiring banks 54 could all be grouped together, but to do so would be at the expense of increasing wiring densities and creating manufacturing difficulties such as having inadequate wiring angles for attaching bond pads 45 to conductive leads 32. Yet, alternatives exist that will effectively accommodate the grouping of wiring banks 54 about package 20 that provide ease of electrical connection with other external circuits and are within the spirit of the present invention.

In response to industry demands for thin packages, this embodiment depicts compound 50 as being disposed upon top side 60 of substrate 26 while bottom side 62 remains uncovered. It is possible, however, to forego disposing any of compound 50 on substrate 26. It is preferred, however, that at least a partial encapsulation of compound 50 is applied about substrate 26 to prevent undesirable conditions, such as electrical shorting.

Although the arrangement of the discrete electrically isolated semiconductor chips 22 has heretofore been described as either being two or eight in number and fabricated in adjacent arrangement with one another within substantially rectangular packages, one skilled in the art should appreciate that still other embodiments exist that are within the express teachings of the present invention. For example, it is contemplated that semiconductor chips 22 range in preferred quantities from 2 to 8 but may also be as large as 64 or more. The arrangement of semiconductor chips 22 may also be fabricated into various other patterns so long as chips 22 remain as discrete, electrically isolated units integrally formed on singular coextensive substrate 26.

The steps of fabrication of multichip package 20 include a singular substrate 26 being fabricated with a plurality of electrically isolated semiconductor chips 22 thereon. Instead of a singulation process of sawing the individual chips into discrete single-chips for packaging, chips 22 are kept as integrally form electrically isolated elements that are there after electrically connected together. Next, bond pads 45 are provided to connect to the active devices (not shown) by exposing bond pads 45 through apertures in an insulating or passivation layer which forms the upper surface of chip 22.

Conductive leads 32, which form the inner portion of the singular lead frame 28, are then positioned over chips 22 and extended in length to an area near bond pads 45 for wire bonding connections thereto. Conductive leads 32 are usually prefabricated with a plating of a thin layer of suitable metal at terminal end 48 but can also be plated after encapsulation. In sequence, conductive leads 32 are connected to an upper surface of chips 22 with LOC adhesive 27. For a detailed description thereof, refer to U.S. Pat. No. 5,286,679, issued to Farnsworth et al., which is incorporated herein by reference.

Once connected, package 20 is at least partially encapsulated with compound 50 and openings are formed therein to at least partially expose conductive leads 32, where exposure preferably is at electrode bond area 58. Also, conductive leads 32 are usually prefabricated with a plating of a thin layer of suitable metal at electrode bond area 58. After encapsulation, any remaining resin residue that is present on the wire or electrode bond area 46, 58 is removed by electrolytic or mechanical deflash processes known in the art.

Lastly, electrodes 30, preferably solder balls, are bonded to electrode bond areas 58 through openings in compound 50. The solder balls may be attached, as is known in the art, by coating the solder balls or bond areas 58 with flux, placing the solder balls on electrode bond area 58 through openings with conventional pick and place or shaker/hopper equipment, and reflowing the balls in place using an infrared or hot air reflow process. The excess flux is then removed with an appropriate cleaning agent. In this manner, the solder balls are electrically and mechanically connected to conductive leads 32 to form electrodes 30 external to compound 50. Other processes may also be used to form electrodes 30. For example, electrodes 30 may be "plated up" using conventional plating techniques rather than using the solder ball techniques as described above. The completed multichip semiconductor package 20 can then be assembled to a printed circuit board or the like using conventional surface mount or through hole processes and equipment.

While there has been shown and described a novel multichip package having a package footprint configured independently of the size of the individual semiconductor chips therein that is made with conventional leaded chip packaging processes and equipment, it is to be appreciated that the present invention may be embodied in other specific forms without departing from its spirit or essential characteristics. The described embodiments are to be considered, in all respects, only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A multichip package, comprising:
   a plurality of electrically isolated semiconductor chips situated upon a semiconductor substrate that is a unitary, separated piece of a semiconductor wafer;
   a plurality of conductive leads, not integrally fabricated into the semiconductor substrate, that electrically connect the electrically isolated semiconductor chips on the semiconductor substrate;
   a compound encapsulating at least a portion of the semiconductor substrate; and
   a plurality of solder balls for electrically communicating with the semiconductor chips through said compound;
   wherein each conductive lead has an extended portion of increased surface area on one side thereof that makes contact with a solder ball of the plurality of solder balls and has a linear portion with no extended portion on an opposite side thereof that faces a linear portion of an adjacent conductive lead.

2. A multichip package according to claim 1, wherein said solder balls project from the semiconductor chips to extend above said compound.

3. A multichip package according to claim 2, wherein said solder balls are arranged linearly across said semiconductor substrate in at least two lines.

4. A multichip package according to claim 3, wherein said plurality of conductive leads provide electrical communication between said solder balls and said semiconductor chips.

5. A multichip package according to claim 1, wherein:
   the plurality of electrically isolated semiconductor chips comprise a linear series of adjacent chips; and
   the plurality of conductive leads run substantially parallel to the linear series of adjacent chips and electrically connect each chip to each adjacent chip.

6. A multichip semiconductor package, comprising:
   a plurality of electrically isolated semiconductor chips situated upon a semiconductor substrate that is a unitary, separated piece of a semiconductor wafer, each semiconductor chip having an active device formed thereon;

a plurality of bond pads, each bond pad being electrically connected one per each said active device;

a plurality of conductive leads, not integrally fabricated into the semiconductor substrate, that electrically connect the electrically isolated semiconductor chips, each conductive lead being electrically connected one per each bond pad;

a compound encapsulating at least a portion of the semiconductor substrate, said bond pads, and said conductive leads; and a plurality of solder balls each extending through said compound to make contact with a respective one of said conductive leads;

wherein each conductive lead has an extended portion of increased surface area on one side thereof that makes contact with a solder ball of the plurality of solder balls and has a linear portion with no extended portion on an opposite side thereof that faces a linear portion of an adjacent conductive lead.

7. A multichip package according to claim 6, wherein said conductive leads are disposed in pairs across said semiconductor substrate.

8. A multichip package according to claim 7, wherein each pair of conductive leads has two extended portions of increased surface area to accommodate two solder balls of said plurality of solder balls.

9. A multichip package, comprising:

a plurality of electrically isolated semiconductor chips situated upon a semiconductor substrate that is a unitary, separated piece of a semiconductor wafer;

a compound encapsulating at least a portion of said semiconductor substrate;

a plurality of electrodes, not integrally fabricated into the unitary, separated piece of the semiconductor wafer, in electrical communication with at least one of said plurality of semiconductor chips through said compound; and a plurality of conductive leads, not integrally fabricated into the unitary, separated piece of the semiconductor wafer;

wherein each conductive lead is positioned over the semiconductor substrate and has an extended portion of increased surface area on one side thereof that makes contact with an electrode of said plurality of electrodes and has a linear portion with no extended portion on an opposite side thereof that faces a linear portion of an adjacent conductive lead.

10. A multichip package according to claim 9, wherein said conductive lead has an electrode bond area for contacting with said electrode.

11. A multichip package according to claim 9, further comprising a wiring bank extending about a periphery of said semiconductor substrate.

12. A multichip package according to claim 11 wherein said semiconductor substrate further comprises a plurality of wiring banks extending about said periphery and arranged in a plurality of at least two parallel rows.

13. A multichip package according to claim 9, wherein said compound encapsulates all of said semiconductor substrate.

14. The multichip package according to claim 9, wherein the number of said electrically isolated semiconductor chips on the unitary, separated piece of the semiconductor wafer is not greater than 64.

15. The multichip package according to claim 9, wherein the number of said electrically isolated semiconductor chips on the unitary, separated piece of the semiconductor wafer is from 2 to 8.

16. A multichip package, comprising:

a plurality of electrically isolated semiconductor chips in a unitary, separated piece of a semiconductor wafer, each said chip having an electrical device therein;

a compound encapsulating at least a portion of said unitary, separated piece;

a plurality of electrodes, not integrally fabricated into the unitary, separated piece of the semiconductor wafer, in electrical communication with at least one of said plurality of semiconductor chips through said compound;

a plurality of conductive leads, not integrally fabricated into the unitary, separated piece of the semiconductor wafer, electrically connecting between said electrodes and said at least one of said electrically isolated semiconductor chips;

a plurality of electrical connections each being in electrical communication with one said electrical device of one of said semiconductor chips; and electrical wiring upon the unitary, separated piece of the semiconductor wafer, not integrally fabricated into the unitary, separated piece of the semiconductor wafer, in electrical communication with said plurality of electrical connections so as to place said electrically isolated semiconductor chips on the unitary, separated piece of the semiconductor wafer in electrical communication one with another;

wherein each conductive lead is positioned over the semiconductor substrate and has an extended portion of increased surface area on one side thereof that makes contact with an electrode of said plurality of electrodes and has a linear portion with no extended portion on an opposite side thereof that faces a linear portion of an adjacent conductive lead.

17. The multichip package according to claim 16, wherein:

said conductive leads comprise a plurality of parallel conductive leads; and each said conductive lead has thereon a solder ball.

18. The multichip package according to claim 17, wherein said plurality of parallel conductive leads comprise consecutive first, second, third, and fourth leads, wherein the geometric centers of the respective solder balls on the first and third leads form a line that is:

perpendicular to said plurality of parallel conductive leads; and parallel to a line that is formed by the geometric centers of the respective solder balls on the second and fourth leads.

19. The multichip package according to claim 18, wherein:

a tangent to the periphery of the solder ball on the second lead intersects the solder ball on the third lead; and said tangent is parallel to said plurality of parallel conductive leads and is taken at a point on the solder ball on the second lead that is closest to the third lead.

* * * * *

UNITED STATES PATENT AND TRADEMARK OFFICE
CERTIFICATE OF CORRECTION

PATENT NO.     : 6,429,528 B1
DATED          : August 6, 2002
INVENTOR(S)    : Jerrold L. King and Jerry M. Brooks It is certified that error appears in the above-identified patent and that said Letters Patent is hereby corrected as shown below:

<u>Title page,</u>
Item [57], ABSTRACT,
Line 9, change "Encapsulated" to -- Encapsulation --

Signed and Sealed this

Thirty-first Day of December, 2002

JAMES E. ROGAN
*Director of the United States Patent and Trademark Office*